US012348234B1

(12) United States Patent
Dai et al.

(10) Patent No.: US 12,348,234 B1
(45) Date of Patent: Jul. 1, 2025

(54) CLOCK AND DATA RECOVERY CIRCUIT

(71) Applicant: NOVATEK Microelectronics Corp., Hsin-Chu (TW)

(72) Inventors: Yan-Siou Dai, Miaoli County (TW); Ming-Hwa Lee, Hsinchu County (TW); Nai-Sheng Shih, Taichung (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 18 days.

(21) Appl. No.: 18/586,592

(22) Filed: Feb. 26, 2024

(51) Int. Cl.
*H03L 7/089* (2006.01)
*H03L 7/08* (2006.01)

(52) U.S. Cl.
CPC .......... *H03L 7/0895* (2013.01); *H03L 7/0807* (2013.01)

(58) Field of Classification Search
CPC ............................ H03L 7/0895; H03L 7/0807
USPC ......................................................... 375/354
See application file for complete search history.

(56) References Cited

U.S. PATENT DOCUMENTS

| 7,587,012 | B2* | 9/2009 | Evans | H03L 7/0814 375/357 |
| 11,641,267 | B2* | 5/2023 | Lee | H04L 7/02 375/354 |
| 2022/0190999 | A1* | 6/2022 | Ju | H04L 7/0079 |
| 2023/0246800 | A1* | 8/2023 | Song | H04L 7/033 |

* cited by examiner

*Primary Examiner* — Dominic D Saltarelli
(74) *Attorney, Agent, or Firm* — Winston Hsu

(57) ABSTRACT

A clock and data recovery (CDR) circuit includes a low pass filter (LPF) and a charge pump (CP) circuit. The LPF includes a filtering resistor and a filtering capacitor. The CP circuit, coupled to the LPF, includes an operational amplifier, a first high-side switch circuit, a first low-side switch circuit, a second high-side switch circuit, a second low-side switch circuit, a first compensation resistor and a second compensation resistor. The first high-side switch circuit and the first low-side switch circuit are coupled to an output terminal of the operational amplifier. The second high-side switch circuit and the second low-side switch circuit are coupled to a first input terminal of the operational amplifier through the LPF. The first compensation resistor is coupled to the first high-side switch circuit. The second compensation resistor is coupled to the first low-side switch circuit.

10 Claims, 5 Drawing Sheets

CLOCK AND DATA RECOVERY CIRCUIT

BACKGROUND OF THE INVENTION

1. Field of the Invention

The present invention relates to a clock and data recovery (CDR) circuit, and more particularly, to a CDR circuit in which the charge pump circuit has an ultra-low charge sharing effect.

2. Description of the Prior Art

A clock and data recovery (CDR) circuit is an important component in a serial receiver. The CDR circuit may receive input signals from a transmitter to generate an output clock signal. The CDR circuit may then use the recovered clock signal to sample upcoming input signals and control the phase and frequency of the recovered clock signal by continuously measuring the data transitions.

In general, the CDR circuit may include a charge pump (CP) circuit for converting up signals and down signals generated by sampling the input signals into a control voltage, which is further applied to control and adjust the frequency of the clock signal. However, the impedance mismatch between the input channel and the output channel of the CP circuit may result in a charge sharing effect. The charge sharing effect causes that the outputs of the up signals and the down signals become imbalanced such that the control voltage deviates from its ideal value, thereby degrading the performance of the CDR circuit.

SUMMARY OF THE INVENTION

It is therefore an objective of the present invention to provide a novel clock and data recovery (CDR) circuit, to achieve an ultra-low charge sharing effect and solve the abovementioned problem.

An embodiment of the present invention discloses a CDR circuit, which comprises a low pass filter (LPF) and a charge pump (CP) circuit. The LPF comprises a filtering resistor and a filtering capacitor. The CP circuit, coupled to the LPF, comprises an operational amplifier, a first high-side switch circuit, a first low-side switch circuit, a second high-side switch circuit, a second low-side switch circuit, a first compensation resistor and a second compensation resistor. The first high-side switch circuit is coupled to an output terminal of the operational amplifier. The first low-side switch circuit is coupled to the output terminal of the operational amplifier. The second high-side switch circuit is coupled to a first input terminal of the operational amplifier through the LPF. The second low-side switch circuit is coupled to the first input terminal of the operational amplifier through the LPF. The first compensation resistor is coupled to the first high-side switch circuit. The second compensation resistor is coupled to the first low-side switch circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
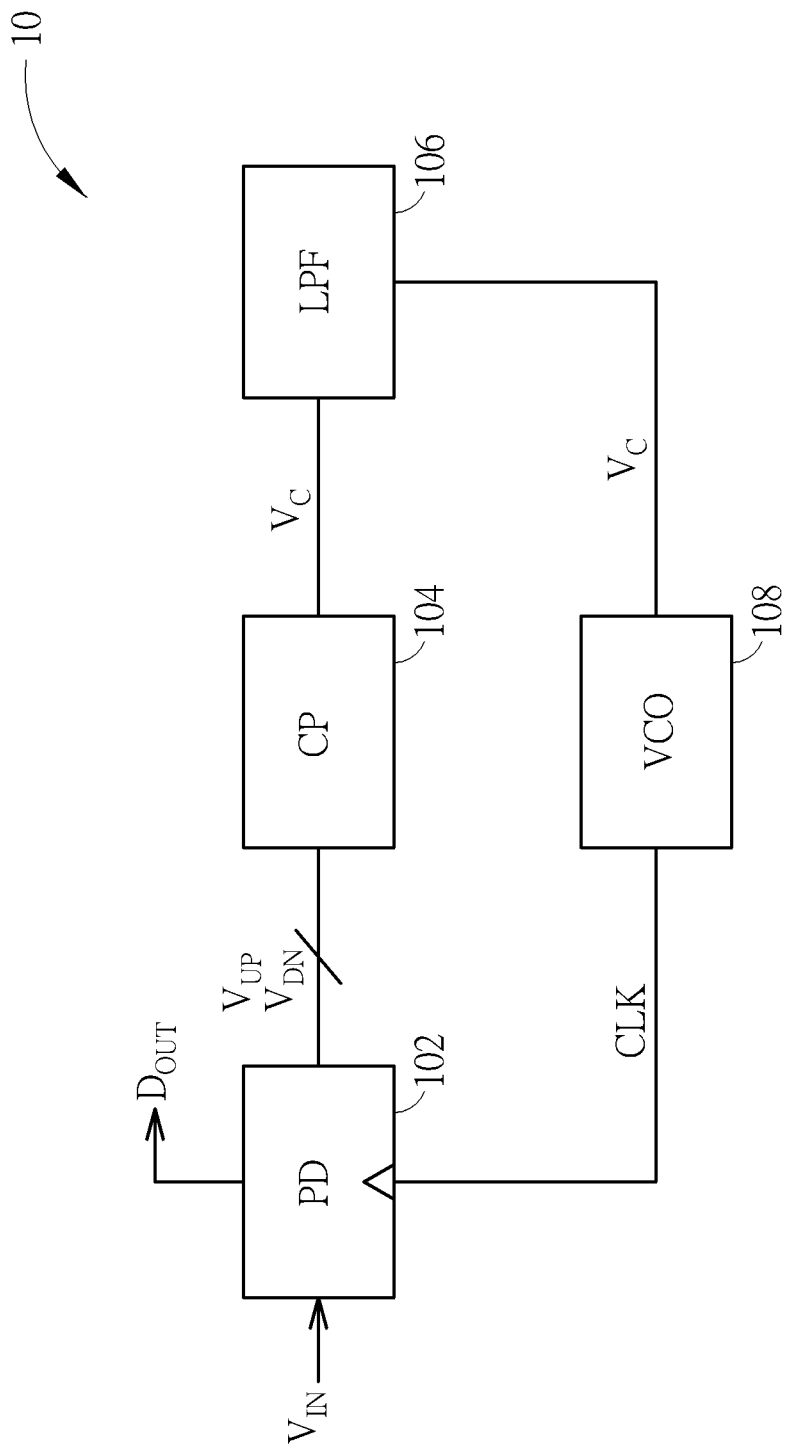
FIG. 1 is a schematic diagram of a CDR circuit according to an embodiment of the present invention.

FIG. 1 is a schematic diagram of a clock and data recovery (CDR) circuit 10 according to an embodiment of the present invention. The CDR circuit 10 includes a phase detector (PD) 102, a charge pump (CP) circuit 104, a low pass filter (LPF) 106, and a voltage-controlled oscillator (VCO) 108. The CDR circuit 10, which is usually implemented in the receiver side of a high speed transceiver system, may receive an input signal $V_{IN}$. The input signal $V_{IN}$ includes information of an output data $D_{OUT}$ and a clock signal. The CDR circuit 10 is configured to extract the output data $D_{OUT}$ and the clock signal embedded in the input signal $V_{IN}$.

The PD 102 is configured to receive the input signal $V_{IN}$ and generate a series of up signals $V_{UP}$ and down signals $V_{DN}$ according to the input signal $V_{IN}$. More specifically, the PD 102 may sample the input signal $V_{IN}$ by using a reference clock CLK received from the VCO 108 to generate the output data $D_{OUT}$. The PD 102 may also generate the up signals $V_{UP}$ and the down signals $V_{DN}$ based on the relations between the input signal $V_{IN}$ and the reference clock CLK. If the frequency and phase of the reference clock CLK reach their accurate values, the PD 102 may generate the accurate output data $D_{OUT}$.

The CP circuit 104, which is coupled to the PD 102, is configured to convert the up signals $V_{UP}$ and the down signals $V_{DN}$ into charging currents and discharging currents, respectively. These currents may be output to the LPF 106, to generate a control voltage $V_C$ at the output terminal of the LPF 106. The control voltage $V_C$ may be filtered by the LPF 106 and then output to the VCO 108.

The VCO 108 may generate the reference clock CLK based on the control voltage $V_C$. In the CDR circuit 10, the VCO 108 is coupled between the LPF 106 and the PD 102 to form a feedback loop. The feedback mechanism allows the VCO 108 to calibrate the reference clock CLK, to control the frequency and phase of the reference clock CLK to converge to their accurate values. The accurate reference clock CLK is able to sample the input signal $V_{IN}$ on appropriate timing to generate the accurate output data $D_{OUT}$.

Note that the accurate reference clock CLK is generated from the accurate control voltage $V_C$, which is further generated from an appropriate balance of the CP circuit 104. However, the charge sharing effect generated during state transitions of the CP circuit 104 may cause that the up signals $V_{UP}$ and the down signals $V_{DN}$ provide different magnitudes of contributions to the control voltage $V_C$, resulting in an imbalance between the up phase and the down phase. This makes the control voltage $V_C$ generated by the CP circuit 104 deviate from its accurate value. The mismatch of the parasitic capacitors in the CP circuit 104 may further increase the influence of the charge sharing effect.

Figure 2:
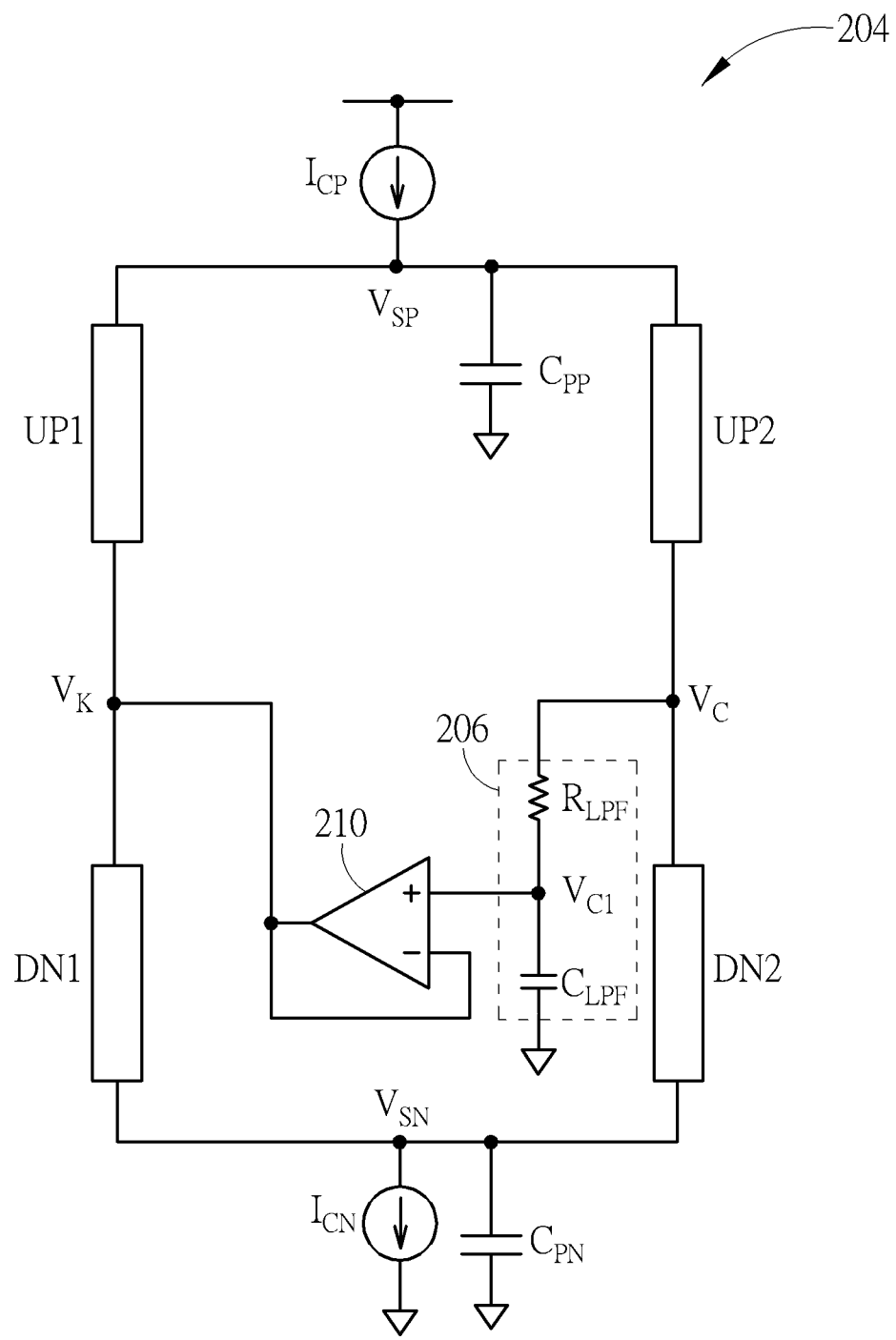
FIG. 2 is a schematic diagram of a CP circuit and an LPF.

FIG. 2 is a schematic diagram of a CP circuit 204 and an LPF 206. The CP circuit 204 includes an operational amplifier 210, a high-side current source $I_{CP}$, a low-side current source $I_{CN}$, two high-side switch circuits UP1 and UP2, and two low-side switch circuits DN1 and DN2. The LPF 206, which is coupled to the CP circuit 204, is composed of a filtering resistor $R_{LPF}$ and a filtering capacitor $C_{LPF}$. A parasitic capacitor $C_{PP}$ that may be coupled to the high-side current source $I_{CP}$ and a parasitic capacitor $C_{PN}$ that may be coupled to the low-side current source $I_{CN}$ are also shown in FIG. 2 to facilitate the illustrations.

In detail, the high-side current source $I_{CP}$ may be coupled to the high-side switch circuits UP1 and UP2, to supply currents to the high-side switch circuits UP1 and UP2, and the low-side current source IN may be coupled to the low-side switch circuits DN1 and DN2, to draw currents from the low-side switch circuits DN1 and DN2. The high-side switch circuit UP1 and the low-side switch circuit DN1 may form a precharging channel, which may be coupled to the output terminal of the operational amplifier 210. The high-side switch circuit UP2 and the low-side switch circuit DN2 may form an output channel, which may be coupled to the positive input terminal of the operational amplifier 210 through the filtering resistor $R_{LPF}$ of the LPF 206. The output channel is configured to generate the control voltage $V_C$ at the node between the high-side switch circuit UP2 and the low-side switch circuit DN2. The negative input terminal of the operational amplifier 210 may be coupled to its output terminal. Each of the high-side switch circuits UP1 and UP2 and the low-side switch circuits DN1 and DN2 may include one or more switch elements, which are turned on or off appropriately in different states to generate charging and discharging currents based on the up signals $V_{UP}$ and the down signals $V_{DN}$ received by the CP circuit 204.

Figure 3A:
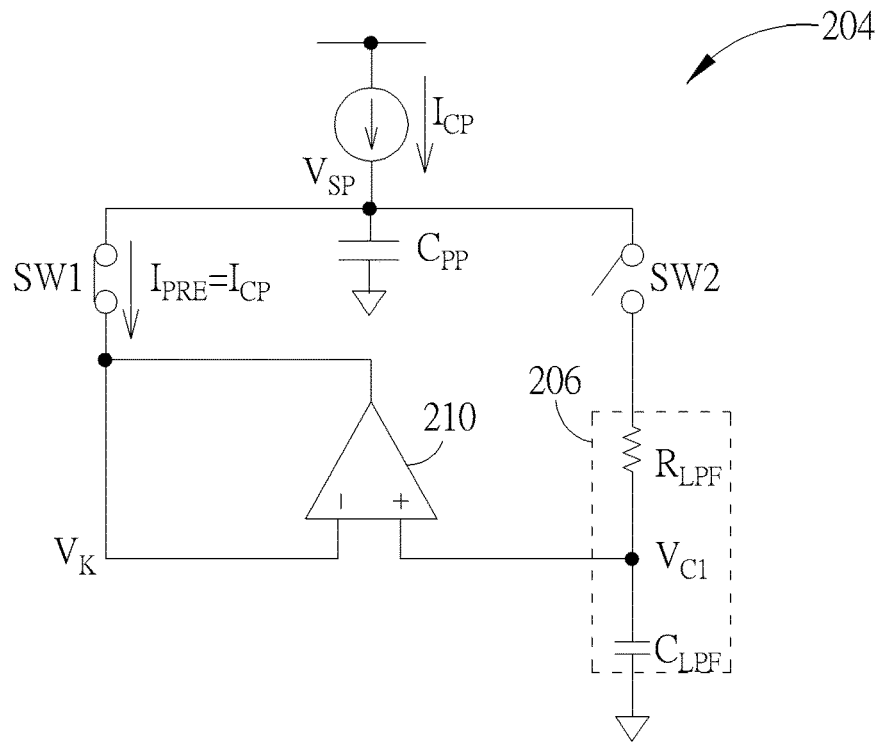
FIG. 3A and FIG. 3B illustrate the operations of the CP circuit shown in FIG. 2.
Figure 3B:
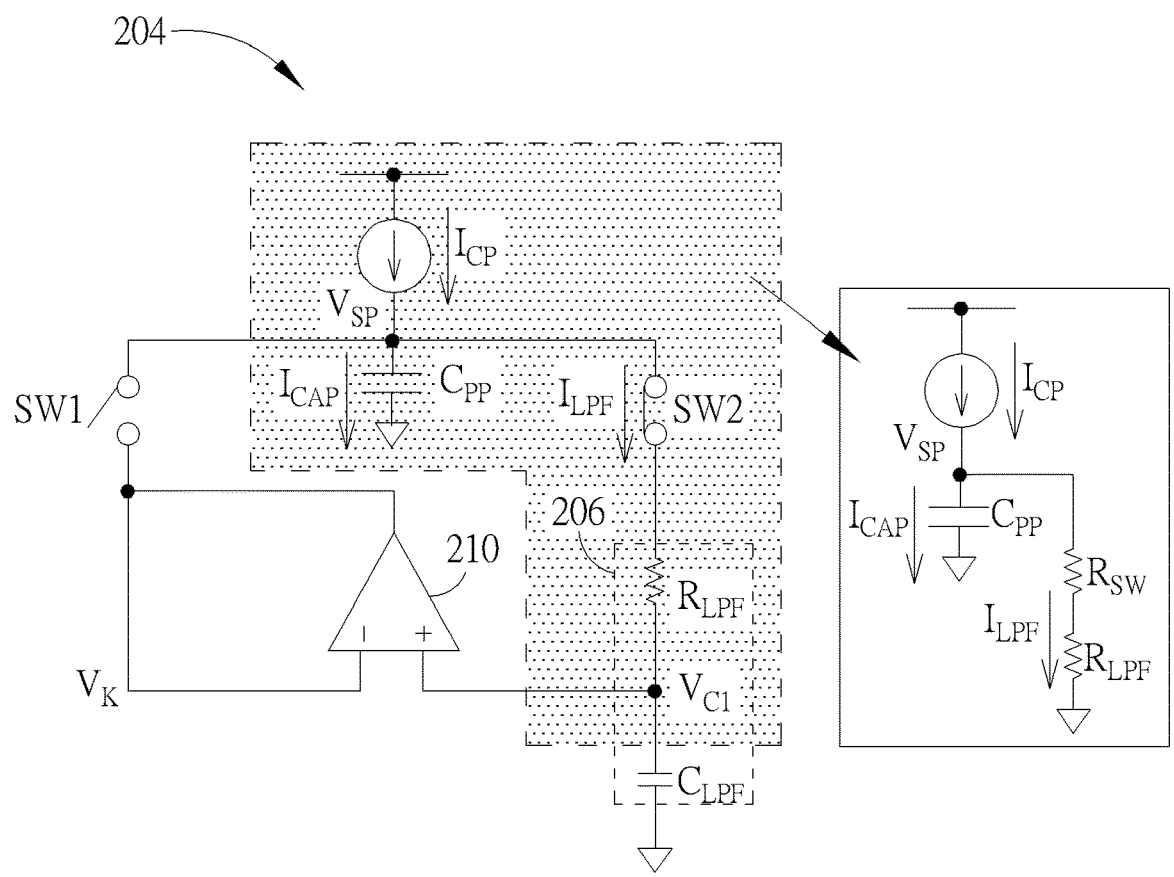

FIGS. 3A and 3B illustrate the operations of the CP circuit 204 shown in FIG. 2. As shown in FIGS. 3A and 3B, the high-side switch circuit UP1 includes a switch element SW1, and the high-side switch circuit UP2 includes a switch element SW2. The switch elements SW1 and SW2 may be controlled by the up signals $V_{UP}$ received from the PD in the previous stage.

FIG. 3A shows a precharge state, in which the switch element SW1 is conducted and the switch element SW2 is cutoff. The output current of the high-side current source $I_{CP}$ may serve as a precharge current $I_{PRE}$ flowing through the precharging channel. In the precharge state, the voltage $V_{SP}$ at the lower terminal of the high-side current source $I_{CP}$ will be equal to:

$$V_{SP}(PRE)=V_K+R_{SW}I_{CP};$$

where $V_K$ is the voltage at the output terminal and the negative input terminal of the operational amplifier 210, and $R_{SW}$ is the on-resistance of the switch element SW1.

FIG. 3B shows an output state after the precharge state. In the output state, the switch element SW1 is cutoff and the switch element SW2 is conducted. The current of the high-side current source $I_{CP}$ may be output to the LPF 206 through the output channel. After the output state becomes steady, the voltage $V_{SP}$ at the lower terminal of the high-side current source $I_{CP}$ will be equal to:

$$V_{SP}(OUT)=V_{C1}+I_{CP}\cdot(R_{IPF}+R_{SW});$$

where $V_{C1}$ is the voltage at the positive input terminal of the operational amplifier 210, and the on-resistance of the switch element SW2 is supposed to be equal to the on-resistance of the switch element SW1.

Note that the voltage $V_{C1}$ may be equal to the voltage $V_K$ due to the virtual short-circuit between the input terminals of the operational amplifier 210. Therefore, the voltage $V_{SP}$ from the precharge state to the output state rises with a level equivalent to $I_{CP} \times R_{LPF}$. The IR voltage variation may generate a charge sharing effect to change the transient current at the output channel during the state transition, especially when the CP circuit 204 is in a high speed operation.

More specifically, as the circuit model shown in FIG. 3B, during the signal transition from the precharge state to the output state, the increase of the voltage $V_{SP}$ requires that more electric charges are accumulated in the parasitic capacitor $C_{PP}$, which means that the parasitic capacitor $C_{PP}$ is charged by a transient current $I_{CAP}$. Since partial electric charges provided by the output current of the high-side current source $I_{CP}$ are supplied to charge the parasitic capacitor $C_{PP}$, the current $I_{LPF}$ and the corresponding electric charges actually flowing to the output channel for generating the control voltage $V_C$ may decrease, which changes the transient level of the control voltage $V_C$ and thereby influences the loop balance of the CDR circuit.

Note that for the sake of simplicity, FIGS. 3A and 3B merely show the upper half part of the CP circuit 204 to illustrate the operations of the up phase where an up signal $V_{UP}$ is received. One of ordinary skill in the art may derive the operations of the down phase where a down signal $V_{DN}$ is received associated with the lower half part of the CP circuit 204 in a similar manner.

As can be seen, the charge sharing effect generated in the high-side circuitry may influence the charging current (e.g., the current $I_{LPF}$ shown in FIG. 3B) output to the output channel, and the charge sharing effect generated in the low-side circuitry may influence the discharging current drawn from the output channel. In order to achieve the loop balance, the influence of the charge sharing effect on the charging current should perfectly cancel the influence of the charge sharing effect on the discharging current. However, the high-side circuitry (including the high-side current source $I_{CP}$ and the high-side switch circuits UP1 and UP2) is usually implemented with PMOS transistors, while the low-side circuitry (including the low-side current source $I_{CN}$ and the low-side switch circuits DN1 and DN2) is usually implemented with NMOS transistors. Therefore, the parasitic capacitors $C_{PP}$ and $C_{PN}$ usually have different capacitance values due to the difference of the characteristics of PMOS and NMOS transistors and the process mismatch. In such a situation, it is necessary to cancel the charge sharing effect in the CP circuit 204, especially during state transitions.

Figure 4:
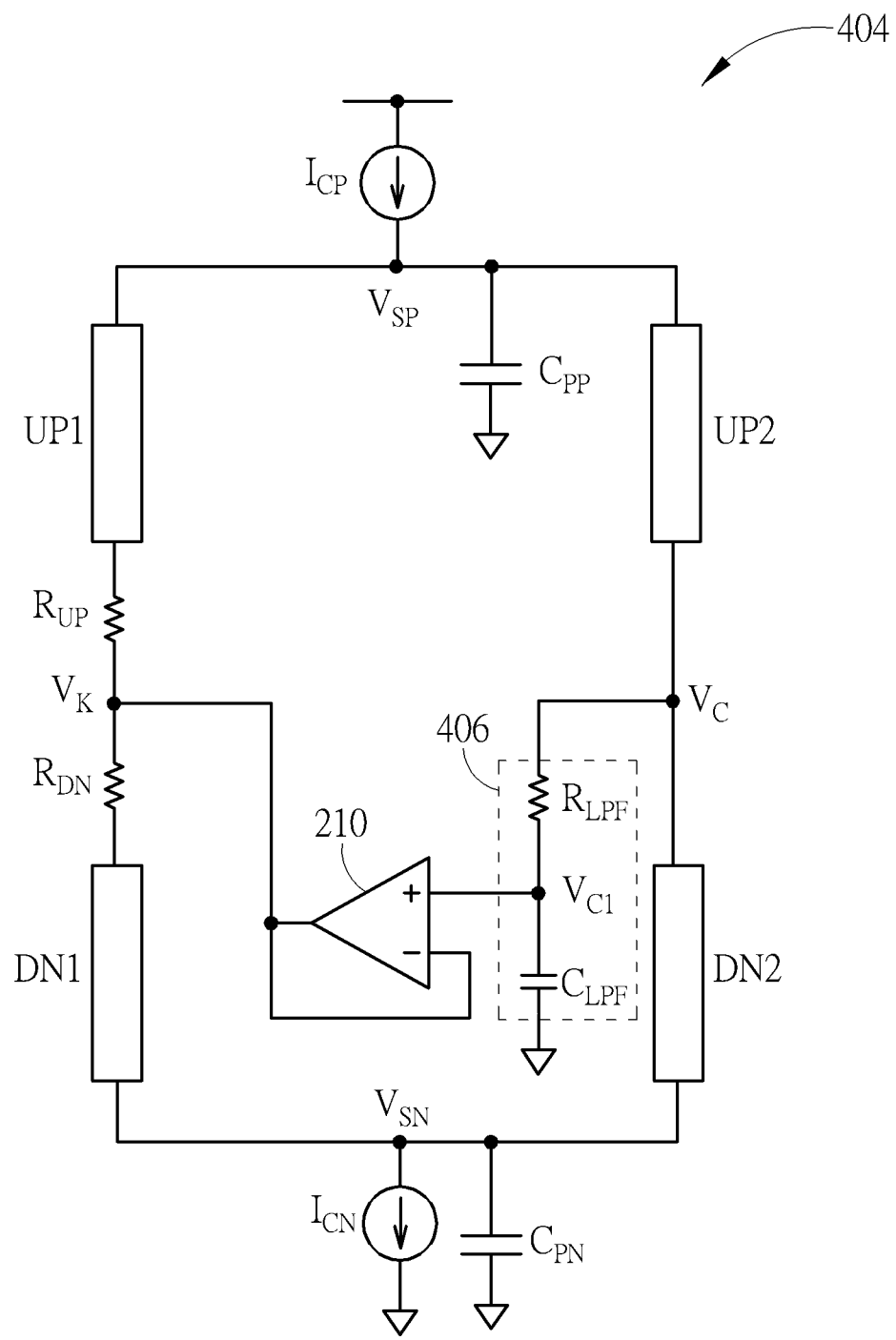
FIG. 4 is a schematic diagram of a CP circuit and an LPF according to an embodiment of the present invention.

FIG. 4 is a schematic diagram of a CP circuit 404 and an LPF 406 according to an embodiment of the present invention. The CP circuit 404 may be implemented as the CP circuit 104 to be included in the CDR circuit 10, and the LPF 406 may be implemented as the LPF 106 to be included in the CDR circuit 10. The structures of the CP circuit 404 and the LPF 406 are similar to those of the CP circuit 204 and the LPF 206 shown in FIG. 2, so signals and elements having similar functions are denoted by the same symbols. The difference between the CP circuit 404 and the CP circuit 204 is only in that, the CP circuit 404 further includes compensation resistors $R_{UP}$ and $R_{DN}$, where the compensation resistor $R_{UP}$ is coupled between the high-side switch circuit UP1 and the output terminal of the operational amplifier 210, and the compensation resistor $R_{DN}$ is coupled between the low-side switch circuit DN1 and the output terminal of the operational amplifier 210.

In an embodiment, the resistance value of the compensation resistor $R_{UP}$ and the resistance value of the compensation resistor $R_{DN}$ may be substantially equal to the resistance value of the filtering resistor $R_{LPF}$ of the LPF 406. Therefore, in the precharge state of the up phase, the voltage $V_{SP}$ at the lower terminal of the high-side current source $I_{CP}$ will be equal to:

$$V_{SP}(\text{PRE}) = V_K + I_{CP} \cdot (R_{UP} + R_{SW});$$

and in the output state of the up phase, the voltage $V_{SP}$ will be equal to:

$$V_{SP}(\text{OUT}) = V_{C1} + I_{CP} \cdot (R_{LPF} + R_{SW}).$$

Note that the voltage $V_{C1}$ may be equal to the voltage $V_K$ and that the resistance values of $R_{UP}$ and $R_{LPF}$ may be equal. Therefore, the voltage $V_{SP}$ at the lower terminal of the high-side current source $I_{CP}$ will not change from the precharge state to the output state, which means that no charge sharing effect appears during state transition of the CP circuit 404.

In the CP circuit 404, the compensation resistor $R_{UP}$ is newly added in the high-side circuitry to make the overall resistance value of the precharging channel equivalent to the overall resistance value of the output channel, so that the voltage $V_{SP}$ will not change during state transition, so as to cancel the charge sharing effect. In a similar manner, the compensation resistor $R_{DN}$ is newly added in the low-side circuitry to cancel the charge sharing effect. Without the charge sharing effects in both the high-side circuitry and the low-side circuitry of the CP circuit 404, the control voltage $V_C$ generated by the CP circuit 404 may be accurate, so as to improve the loop balance of the CDR circuit.

Note that the above balance is established under an assumption that the switch circuits UP1, UP2, DN1 and DN2 have the same on-resistance $R_{SW}$. However, in a practical circuit, the on-resistance of these switch circuits UP1, UP2, DN1 and DN2 may have offsets due to various factors such as the cross voltage of the switch element, temperature, process mismatch, and channel length modulation effect. In addition, the operational amplifier 210 and the current sources $I_{CP}$ and $I_{CN}$ may also possess offsets to some extent. Such offsets and mismatch may still result in a charge sharing effect that might affect the output result of the control voltage $V_C$. In order to solve this problem, a degeneration resistor may be deployed in any of the switch circuits UP1, UP2, DN1 and DN2, to be connected in series with the switch element included in the corresponding switch circuit. The degeneration resistor may have a larger resistance value (e.g., at least larger than the on-resistance of the switch element), so that the influence of the offsets and mismatch may be diluted.

Figure 5:
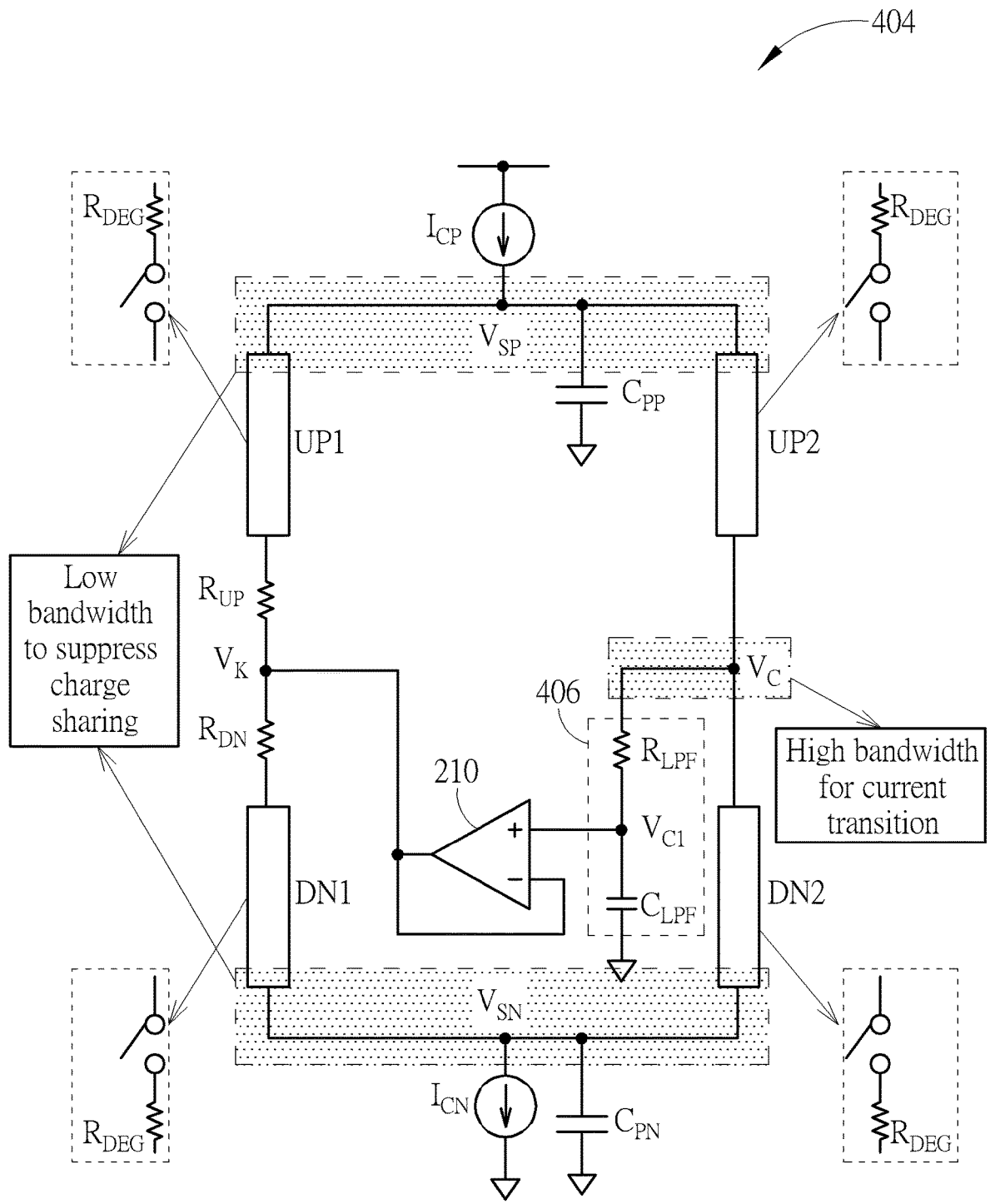
FIG. 5 is a schematic diagram of the CP circuit with a detailed implementation of the switch circuits according to an embodiment of the present invention.

FIG. 5 is a schematic diagram of the CP circuit 404 with a detailed implementation of the switch circuits UP1, UP2, DN1 and DN2 according to an embodiment of the present invention. As shown in FIG. 5, each of the switch circuits UP1, UP2, DN1 and DN2 may include a switch element and a degeneration resistor $R_{DEG}$ connected in series. The resistance value of the degeneration resistor $R_{DEG}$ in different switch circuits should be identical, to suppress the influence caused by the mismatch between the on-resistance of the switch elements in different switch circuits. This reduces the offsets generated on the control voltage $V_C$ resulting from the charge sharing effect, and thereby improves the balance of the CP circuit 404. More specifically, the variation of the voltage $V_{SP}$ or $V_{SN}$ from the precharge state to the output state may be minimized to achieve the balance in state transition. The charge sharing effects generated in the high-side circuitry and the low-side circuitry may also be minimized to achieve the balance of the output result of the control voltage $V_C$.

Therefore, in an embodiment, the on-resistance of the switch element included in the switch circuits UP1, UP2, DN1 and DN2 may be designed to be as minimum as possible, and an additional degeneration resistor $R_{DEG}$ is added in the switch circuits UP1, UP2, DN1 and DN2. If the resistance value of the degeneration resistor $R_{DEG}$ is far greater than the on-resistance of the switch element, the overall resistance value of the switch circuits UP1, UP2, DN1 and DN2 may be mainly determined by the degeneration resistor $R_{DEG}$. In such a situation, the mismatch between the resistance value of the switch circuits UP1, UP2, DN1 and DN2 may be reduced, so as to suppress the influence of the charge sharing effect.

In order to minimize the mismatch between the degeneration resistor $R_{DEG}$ of different switch circuits UP1, UP2, DN1 and DN2, it is preferable to let the resistance value of the degeneration resistor $R_{DEG}$ to be as large as possible. However, the increasing resistance value will generate an increasing voltage drop; hence, the resistance value is still limited by the voltage headroom of the current mirror in the CP circuit 404 so as not to affect the performance of the current sources $I_{CP}$ and $I_{CN}$.

In the embodiment as shown in FIG. 5, while the compensation resistor $R_{UP}$ is coupled to the lower terminal of the switch element included in the high-side switch circuit UP1, the degeneration resistor $R_{DEG}$ of the high-side switch circuit UP1 may be coupled to the upper terminal of this switch element (i.e., coupled between this switch element and the high-side current source $I_{CP}$). While the compensation resistor $R_{DN}$ is coupled to the upper terminal of the switch element included in the low-side switch circuit DN1, the degeneration resistor $R_{DEG}$ of the low-side switch circuit DN1 may be coupled to the lower terminal of this switch element (i.e., coupled between this switch element and the low-side current source $I_{CN}$). Correspondingly, the degeneration resistor $R_{DEG}$ of the high-side switch circuit UP2 may be coupled to the upper terminal of the corresponding switch element (i.e., coupled between this switch element and the high-side current source $I_{CP}$), and the degeneration resistor $R_{DEG}$ of the low-side switch circuit DN2 may be coupled to the lower terminal of the corresponding switch element (i.e., coupled between this switch element and the low-side current source $I_{CN}$).

Note that the degeneration resistor $R_{DEG}$ is preferably coupled between the corresponding switch element and current source; that is, the degeneration resistor $R_{DEG}$ in the high-side circuitry is preferably coupled to the upper terminal of the switch element, and the degeneration resistor $R_{DEG}$ in the low-side circuitry is preferably coupled to the lower terminal of the switch element. The resistance value of the degeneration resistor $R_{DEG}$ is usually larger than the on-resistance of the switch element. This deployment will increase the impedance faced at the nodes between the current source and the switch circuit, so as to reduce the bandwidth at those nodes. The reduced bandwidth may suppress the charge sharing effect resulting from the voltage variations of $V_{SP}$ and $V_{SN}$.

In addition, since the degeneration resistor $R_{DEG}$ of the high-side switch circuit UP2 is coupled to the upper terminal of the corresponding switch element and the degeneration resistor $R_{DEG}$ of the low-side switch circuit DN2 is coupled to the lower terminal of the corresponding switch element, the output terminal of the LPF 406 may not face excessively large impedance of the degeneration resistor $R_{DEG}$ and thus may keep at a high bandwidth state. The high bandwidth ensures that the output channel has fast current transition in response to the received up signals $V_{UP}$ and down signals $V_{DN}$.

Please note that the present invention aims at providing a novel CDR circuit in which the CP circuit includes several resistors to achieve an ultra-low charge sharing effect. Those skilled in the art may make modifications and alterations accordingly. In an embodiment, a compensation resistor having a resistance value equal to the filtering resistor of the LPF may be deployed in the precharging channel, and this compensation resistor may be coupled to the switch circuit in any manner. For example, in the CP circuit 404 shown in FIG. 4, the compensation resistor $R_{UP}$ is coupled between the high-side switch circuit UP1 and the operational amplifier 210. In another embodiment, the compensation resistor $R_{UP}$ may be coupled between the high-side switch circuit UP1 and the high-side current source $I_{CP}$, and this deployment may further reduce the bandwidth at the lower terminal of the current source $I_{CP}$ to suppress the charge sharing effect. Since the compensation resistor $R_{UP}$ and the degeneration resistor $R_{DEG}$ are both connected to the corresponding switch element in series, in an embodiment, these two resistors may be combined without affecting the operations of the CP circuit 404.

In addition, in the CP circuit 404, the compensation resistors $R_{UP}$ and $R_{DN}$ and the degeneration resistor $R_{DEG}$ may be all included to minimize the influence of the charge sharing effect. In the CP circuit of another embodiment, the charge sharing effect may be suppressed by using several of the resistors. For example, in an embodiment, the CP circuit may only include the compensation resistors to achieve the balance of the precharging channel and the output channel and suppress the charge sharing effect during state transitions. In another embodiment, the CP circuit may only include the degeneration resistor in each switch circuit to reduce the mismatch between different switch circuits. These implementations should all belong to the scope of the present invention.

To sum up, the present invention provides a CP circuit used for a CDR circuit, to achieve an ultra-low charge sharing effect. The CP circuit may include a compensation resistor, of which the resistance value is equal to the resistance value of the filtering resistor of the LPF, so as to reduce the voltage variation at a node of the current source and thereby reduce the charge sharing effect caused by the voltage variation during state transition of the CP circuit. The CP circuit may also include a degeneration resistor coupled to the switch element in each switch circuit. The degeneration resistor may reduce the influence caused by the mismatch between different switch circuits, so as to suppress the charge sharing effect. The reduction of the charge sharing effect will improve the accuracy of the control voltage output by the CP circuit, so as to improve the loop balance of the CDR circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery (CDR) circuit, comprising:
   a low pass filter (LPF), comprising a filtering resistor and a filtering capacitor;
   a charge pump (CP) circuit, coupled to the LPF, comprising:
      an operational amplifier;
      a first high-side switch circuit, coupled to an output terminal of the operational amplifier;
      a first low-side switch circuit, coupled to the output terminal of the operational amplifier;
      a second high-side switch circuit, coupled to a first input terminal of the operational amplifier through the LPF;
      a second low-side switch circuit, coupled to the first input terminal of the operational amplifier through the LPF;
      a first compensation resistor, coupled to the first high-side switch circuit; and
      a second compensation resistor, coupled to the first low-side switch circuit.

2. The CDR circuit of claim 1, wherein a resistance value of the first compensation resistor and a resistance value of the second compensation resistor are substantially equal to a resistance value of the filtering resistor.

3. The CDR circuit of claim 1, wherein the first compensation resistor is coupled between the first high-side switch circuit and the output terminal of the operational amplifier, and the second compensation resistor is coupled between the first low-side switch circuit and the output terminal of the operational amplifier.

4. The CDR circuit of claim 1, wherein the second high-side switch circuit and the second low-side switch circuit are coupled to the first input terminal of the operational amplifier through the filtering resistor.

5. The CDR circuit of claim 1, wherein at least one of the first high-side switch circuit, the first low-side switch circuit, the second high-side switch circuit and the second low-side switch circuit comprises:
   a switch element; and
   a degeneration resistor, coupled to the switch element.

6. The CDR circuit of claim 5, wherein the first compensation resistor is coupled to a first terminal of the switch element of the first high-side switch circuit, and the degeneration resistor of the first high-side switch circuit is coupled to a second terminal of the switch element of the first high-side switch circuit.

7. The CDR circuit of claim 5, wherein the second compensation resistor is coupled to a first terminal of the switch element of the first low-side switch circuit, and the degeneration resistor of the first low-side switch circuit is coupled to a second terminal of the switch element of the first low-side switch circuit.

8. The CDR circuit of claim 1, wherein a second input terminal of the operational amplifier is coupled to the output terminal of the operational amplifier.

9. The CDR circuit of claim 1, wherein the CP circuit further comprises:
   a high-side current source, coupled to the first high-side switch circuit and the second high-side switch circuit; and
   a low-side current source, coupled to the first low-side switch circuit and the second low-side switch circuit.

10. The CDR circuit of claim 1, further comprising:
    a phase detector (PD), coupled to the CP circuit; and
    a voltage-controlled oscillator (VCO), coupled between the PD and the LPF.

* * * * *